(12) United States Patent
Hu

(10) Patent No.: US 10,964,731 B2
(45) Date of Patent: Mar. 30, 2021

(54) ARRAY SUBSTRATE AND MANUFACTURING METHOD THEREOF AND DISPLAY DEVICE

(71) Applicant: Wuhan China Star Optoelectronics Semiconductor Display Technology Co., Ltd., Wuhan (CN)

(72) Inventor: Junyan Hu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/462,549

(22) PCT Filed: Jan. 8, 2019

(86) PCT No.: PCT/CN2019/070729
§ 371 (c)(1),
(2) Date: May 21, 2019

(87) PCT Pub. No.: WO2020/113761
PCT Pub. Date: Jun. 11, 2020

(65) Prior Publication Data
US 2020/0185423 A1   Jun. 11, 2020

(30) Foreign Application Priority Data
Dec. 4, 2018   (CN) .......................... 201811476247.5

(51) Int. Cl.
*H01L 27/12*      (2006.01)
*H01L 27/32*      (2006.01)
*G09F 9/30*       (2006.01)

(52) U.S. Cl.
CPC ............ *H01L 27/127* (2013.01); *G09F 9/301* (2013.01); *H01L 27/124* (2013.01); *H01L 27/1248* (2013.01); *H01L 27/3246* (2013.01)

(58) Field of Classification Search
None
See application file for complete search history.

(56) References Cited

U.S. PATENT DOCUMENTS

2015/0185521 A1   7/2015   Cao et al.
2018/0315809 A1   11/2018  Kim et al.
(Continued)

FOREIGN PATENT DOCUMENTS

| CN | 203179887 | 9/2013 |
| CN | 103943632 | 7/2014 |
| CN | 108288637 | 7/2018 |

*Primary Examiner* — Long Pham

(57) ABSTRACT

An array substrate, a manufacturing method thereof and a display device are disclosed. The array substrate includes a bending section and a pixel section that is adjacent to the bending section, the pixel section comprises a plurality of pixel unit sections and a non-pixel unit section connects with the pixel unit section; the array substrate includes a flexible substrate and an array layer; the array layer includes an array base layer having a first groove and a second groove, the first groove corresponds to the non-pixel unit section of the pixel section; the second corresponds to the bending section; and a filling layer filled in the first groove and the second groove; and an organic dielectric layer disposed on the array base layer and the filling layer, and materials used for the organic dielectric layer and the filling layer are organic photoresist materials.

8 Claims, 5 Drawing Sheets

(56) References Cited

U.S. PATENT DOCUMENTS

2020/0185423 A1* 6/2020 Hu ...................... H01L 27/3258
2020/0243574 A1* 7/2020 Tian .................... H01L 27/1262

* cited by examiner

ARRAY SUBSTRATE AND MANUFACTURING METHOD THEREOF AND DISPLAY DEVICE

RELATED APPLICATIONS

This application is a National Phase of PCT Patent Application No. PCT/CN2019/070729 having International filing date of Jan. 8, 2019, which claims the benefit of priority of Chinese Patent Application No. 201811476247.5 filed on Dec. 4, 2018. The contents of the above applications are all incorporated by reference as if fully set forth herein in their entirety.

FIELD AND BACKGROUND OF INVENTION

The present disclosure relates to the field of display devices and the like, and more particularly to an array substrate, a manufacturing method thereof, and a display device.

Organic light-emitting diode (OLED) displays possess advantages of self-luminosity, wide range of viewing angles, fast response speeds, high contrast, etc., and become mainstream trend of current displays. At present, with the pursuit of the ultimate display experience, comprehensive screens, narrow borders, etc. have become development hotspots in the current display field. Flexible OLED displays are popular and have become a trend. Flexible OLED displays possess many advantages that they have ultra-thin and ultra-light screens, and smaller volume. It is more convenient to carry and has a stronger customer experience.

At present, there is no fully flexible display mobile phone on the market, and partial bending is performed only in the bending section. Generally, the flexible OLED display screen in the prior art etches an inorganic film layer in the bending section, and it is filled with an organic photoresist. Such structure is more difficult to bend in the pixel section.

The technical problems solved by the present disclosure are to provide an array substrate and a manufacturing method thereof, and a display device having the array substrate. By replacing material of a conventional dielectric layer with organic photoresist material, defining a first groove in the pixel section, defining a second groove in the bending section, and filling an organic photoresist material in the first groove and the second groove, stress of each film layers in the array substrate are effectively reduced when bent, thereby achieving bending of the pixel section.

SUMMARY OF THE INVENTION

In order to solve the above technical problems, an array substrate is provided, comprising a bending section and a pixel section that is adjacent to the bending section, wherein the pixel section comprises a plurality of pixel unit sections and a non-pixel unit section connects with the pixel unit section; wherein the array substrate comprises a flexible substrate and an array layer, and the array layer is disposed on the flexible substrate; the array layer comprises: an array base layer having a first groove and a second groove, wherein the first groove corresponds to the non-pixel unit section of the pixel section and a second groove corresponds to the bending section; a filling layer filled in the first groove and the second groove; and an organic dielectric layer disposed on the array base layer and the filling layer, wherein materials used for the organic dielectric layer and the filling layer are organic photoresist materials.

In an embodiment of the present disclosure, a stepped structure is formed within the array base layer by the second groove.

In an embodiment of the present disclosure, the array layer further comprises: a passivation layer disposed on the organic dielectric layer and corresponding to the pixel section; a planarization layer disposed on the passivation layer and the organic dielectric layer; and a pixel defining layer disposed on the planarization layer.

In an embodiment of the present disclosure, materials used for the passivation layer is silicon nitride and a thickness of the passivation layer is less than or equal to 3000 angstroms; a thickness of the organic dielectric layer is 1 um to 1.8 um, a Young's modulus of the organic dielectric layer is less than or equal to 5 GPa, and a heat resistant temperature of the organic dielectric layer is 350° C. to 500° C.

In an embodiment of the present disclosure, the array base layer comprises: a blocking layer disposed on the flexible substrate; a buffer layer disposed on the blocking layer; a first gate insulating layer disposed on the buffer layer; and a second gate insulating layer disposed on the first gate insulating layer; wherein the organic dielectric layer is disposed on the second gate insulating layer; the array layer in the pixel section further comprises: a semiconductor layer disposed on the buffer layer, wherein the first gate insulating layer completely covers the semiconductor layer; a first gate layer disposed on the first gate insulating layer, wherein the second gate insulating layer completely covers the first gate layer; a second gate layer disposed on the second gate insulating layer, wherein the organic dielectric layer is disposed on the second gate layer; a source-drain contact hole extending from the organic dielectric layer to an interior of the buffer layer; a source and a drain disposed on the organic dielectric layer, wherein the source and the drain extend through the corresponding source-drain contact hole and connect to the semiconductor layer; and the passivation layer is disposed on the source and the drain; an anode contact hole extending from the planarization layer to a surface of the drain through the passivation layer; an anode trace disposed on the planarization layer, wherein the anode trace extends through the anode contact hole and connects to the drain; a slot, extending through the whole pixel defining layer, wherein the slot corresponds to the anode trace; and a light emitting layer filled in the slot; wherein the array substrate in the bending section further comprises: a source drain trace disposed on the organic dielectric layer; wherein the planarization layer is disposed on the source-drain trace and the organic dielectric layer.

The present disclosure further provides a manufacturing method of an array substrate, comprising a bending section and a pixel section that is adjacent to the bending section, wherein the pixel section comprises a plurality of pixel unit sections and a non-pixel unit that is connected to the pixel unit section; the manufacturing method of an array substrate comprises following steps of: S1) providing a flexible substrate; S2) forming an array base layer on the flexible substrate; S3) defining a first groove and a second groove on the array base layer, wherein the first groove corresponds to the non-pixel unit section of the pixel section; and the second groove corresponds to the bending section; and S4) filling an organic photoresist material in the first groove and the second groove to form a filling layer, and continuing to coat the organic photoresist material on the filling layer and the array base layer to form an organic dielectric layer.

In an embodiment of the present disclosure, the step S2) comprises steps of: S21) sequentially depositing a blocking layer and a buffer layer on the flexible substrate; S22)

forming a semiconductor layer on the buffer layer in the pixel section; S23) depositing a first gate insulating layer on the semiconductor layer and the buffer layer, depositing a first gate layer on the first gate insulating layer, and patterning the first gate layer to form a first gate; and S24) depositing a second gate insulating layer on the first gate and the first gate insulating layer, depositing a second gate layer on the second gate insulating layer, and patterning the second gate layer to form a second gate; wherein the step S3) further comprises: holing the array base layer to form a first opening, wherein the first opening extends to an interior of the buffer layer from the second gate insulating layer, and the first opening corresponds to the semiconductor layer; wherein the step S4), after the organic dielectric layer is formed, the organic dielectric layer is developed at a position of the first opening to form a second opening connects with the first opening, and the second opening and the first opening form the source-drain contact hole.

In an embodiment of the present disclosure, after the step S4), the manufacturing method further comprising steps of: S5) depositing a first metal film layer in the source-drain contact hole and on the organic dielectric layer, and patterning the first metal film layer to form a source, a drain, a source-drain trace; S6) depositing a passivation layer on the source, the drain, and the organic dielectric layer, and etching all of the passivation layer in the bending section; S7) forming a planarization layer on the passivation layer, the organic dielectric layer, and the source-drain trace, and holing the planarization layer to form an anode contact hole, wherein the anode contact hole extends through the passivation layer to a surface of the drain from the planarization layer; depositing a second metal film layer in the anode contact hole and on the planarization layer, and patterning the second metal film layer to form an anode trace connects with to the drain; S8) forming a pixel defining layer on the planarization layer and the anode trace, and digging a slot on the pixel defining layer, wherein the slot extends through the whole pixel defining layer and corresponds to the anode trace; and S9) filling a light-emitting layer in the slot.

In an embodiment of the present disclosure, the step of forming the second groove in the step S3) comprises the following steps: S31) defining a first recess, wherein the first recess extends to an interior of the buffer layer from the second gate insulating layer, the first recess comprises a first recess bottom that is at the interior of the buffer layer; and S32) defining a second recess, wherein the second recess extends to a surface of the flexible substrate from the first recess bottom of the first recess, and defining a second recess bottom on the surface of the flexible substrate, a vertical projection of the second recess on the flexible substrate completely falls within a vertical projection of the first recess on the flexible substrate, and the second groove that is constituted by the first recess and the second recess is a stepped structure.

The present disclosure further provides a display device, comprising the array substrate.

By replacing the dielectric layer of the pixel section to an organic photoresist, digging a first groove in the non-pixel section, digging a second groove in the bending section, and filling an organic photoresist material in the first groove and the second groove, the array substrate and the display device of the present disclosure can effectively disperse the stress generated by bending. Because a surface of the organic dielectric layer (O-ILD) is damaged when the source, drain and source-drain trace are etched, and certain changes to surface properties of the organic dielectric layer (O-ILD) will occur during the coating of the flat layer, film breakage phenomenon is easily formed. The passivation layer on the source and the drain can better improve the adhesion between the planarization layer and the organic dielectric layer (O-ILD), and the passivation layer can perform some hydrogen replenishment on a channel of a thin film transistor to improve electrical properties. The steps of the manufacturing method of the array substrate of the present disclosure are simple, thereby simplifying the steps and procedures to some extent and facilitating the manufacturing processes.

BRIEF DESCRIPTION OF THE SEVERAL VIEWS OF THE DRAWINGS

In order to illustrate technical solutions in the embodiments of the present disclosure more clearly, the accompanying drawings required in the description of the embodiments are introduced briefly hereafter. It is obvious that the accompanying drawings in the following description are merely part of the embodiments of the present disclosure. People with ordinary skills in the art can obtain other drawings without making inventive efforts.

The present disclosure is further explained below in combination with the following drawings of the embodiments.

REFERENCE NUMERALS IN DRAWINGS

Figure 1:
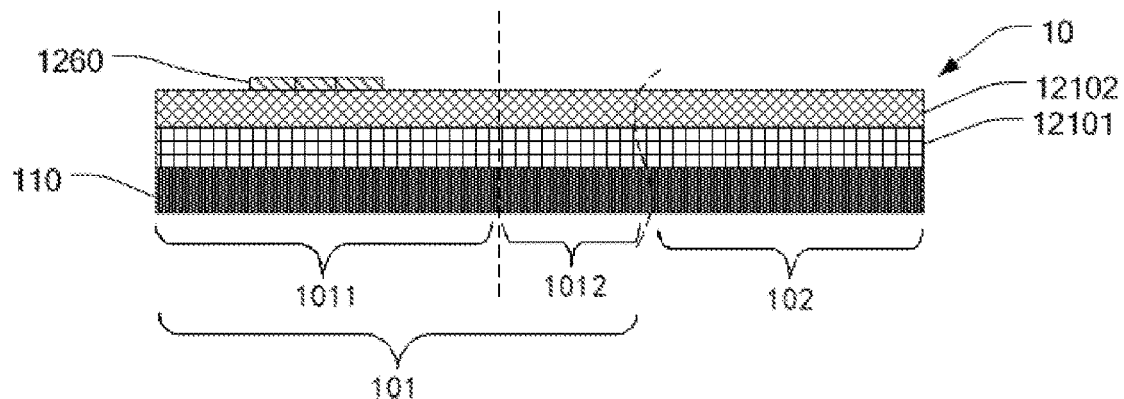
FIG. 1 is a layer diagram of a blocking layer, a buffer layer, and a semiconductor layer in the process of manufacturing an array substrate of an embodiment of the present disclosure.

| | | | |
|---|---|---|---|
| 1 | a display device; | 10 | an array substrate; |
| 20 | an integrated circuit (IC); | 30 | a printed circuit board; |
| 101 | a pixel section; | 102 | a bending section; |
| 1011 | a pixel unit section; | 1012 | a non-pixel unit section; |
| 110 | a flexible substrate; | 120 | an array layer; |

-continued

| 1210 | an array base layer; | 1220 | an organic dielectric layer; |
| 1230 | a planarization layer; | 1240 | a pixel defining layer; |
| 1250 | a filled layer; | 1260 | a semiconductor layer; |
| 1270 | a first gate layer; | 1280 | a second gate layer; |
| 1291 | a source; | 1292 | a drain; |
| 1293 | a source-drain trace; | 1294 | an anode trace; |
| 1200 | a passivation layer; | 12100 | a light-emitting layer; |
| 12101 | a blocking layer; | 12102 | a buffer layer; |
| 12103 | a first gate insulating layer; | 12104 | a second gate insulating layer; |
| 121 | a source-drain contact hole; | 122 | an anode contact hole; |
| 123 | a first groove; | 124 | a second groove; |
| 125 | a slot; | | |
| 1211 | a first opening; | 1212 | a second opening; |
| 1241 | a first recess; | 1242 | a second recess; |
| 12411 | a first recess bottom; | 12421 | a second recess bottom. |

DESCRIPTION OF SPECIFIC EMBODIMENTS OF THE INVENTION

Embodiments of the present disclosure will be described in detail in the following descriptions, examples of which are shown in the accompanying drawings, in which the same or similar reference numerals represent the same or similar elements or elements having the same or similar functions throughout the descriptions. The embodiments described hereinafter with reference to the accompanying drawings are explanatory and illustrative, which are used to generally understand the present disclosure, but shall not be construed to limit the present disclosure.

In the following detailed description, reference is made to the accompanying figures, in which various examples are shown by way of illustration. In this regard, directional terminology mentioned in the present disclosure, such as "up", "down", "front", "back", "left", "right", "top", "bottom", etc., is used with reference to the orientation of the figures being described. Therefore, the directional terminology is used for purposes of illustration and is not intended to limit the present invention.

Figure 10:
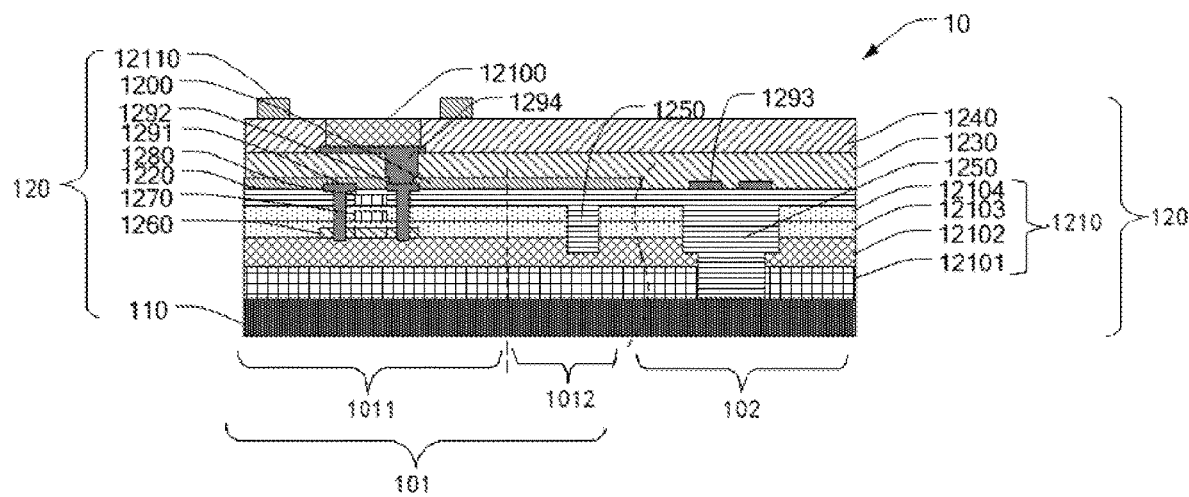
FIG. 10 is a layer diagram of the entire array substrate in the process of manufacturing the array substrate of the embodiment of the present disclosure.
Figure 11:
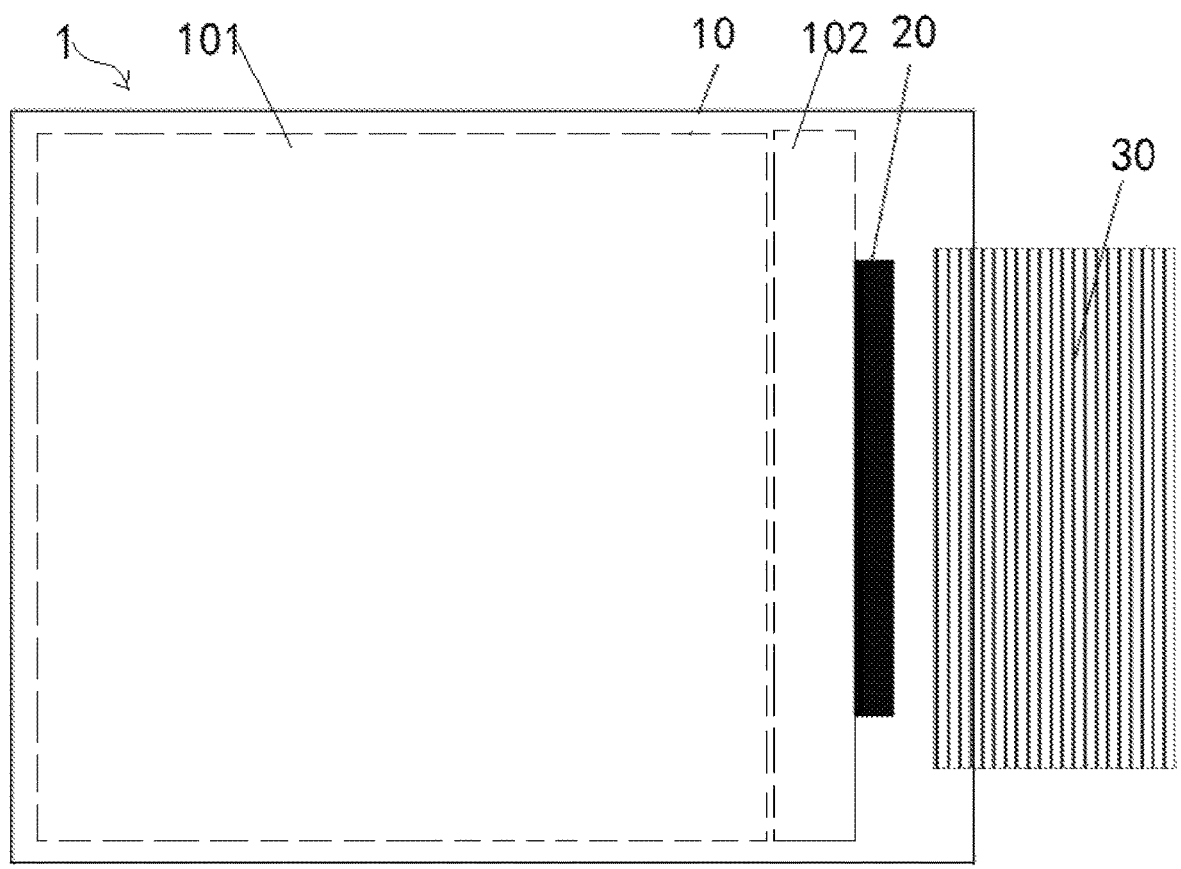
FIG. 11 is a structural diagram of a display device of the embodiment of the present disclosure.

As shown in FIG. 10, in an embodiment, the array substrate 10 of the present disclosure comprises a bending section 102 and a pixel section 101 adjacent to the bending section 102, and the pixel section 101 comprises a plurality of pixel unit sections 1011 and the non-pixel unit section 1012 connects with the pixel unit section 1011.

The array substrate 10 comprises a flexible substrate 110 and an array layer 120. The array layer 120 is disposed on the flexible substrate 110. The array layer 120 comprises an array base layer 1210, an organic dielectric layer 1220, a planarization layer 1230, a pixel defining layer 1240, a filling layer 1250, a semiconductor layer 1260, a first gate layer 1270, a second gate layer 1280, a source 1291 and a drain 1292, a source-drain trace 1293, an anode trace 1294, a passivation layer 1200, and a light-emitting layer 12100. The array base layer 1210 comprises a blocking layer 12101, a buffer layer 12102, a first gate insulating layer 12103, and a second gate insulating layer 12104.

As shown in FIG. 1, the blocking layer 12101 is disposed on the flexible substrate 110. The buffer layer 12102 is disposed on the blocking layer 12101. The first gate insulating layer 12103 is disposed on the buffer layer 12102. The second gate insulating layer 12104 is disposed on the first gate insulating layer 12103. In the pixel section 101, the semiconductor layer 1260 is disposed on the buffer layer 12102.

Figure 2:
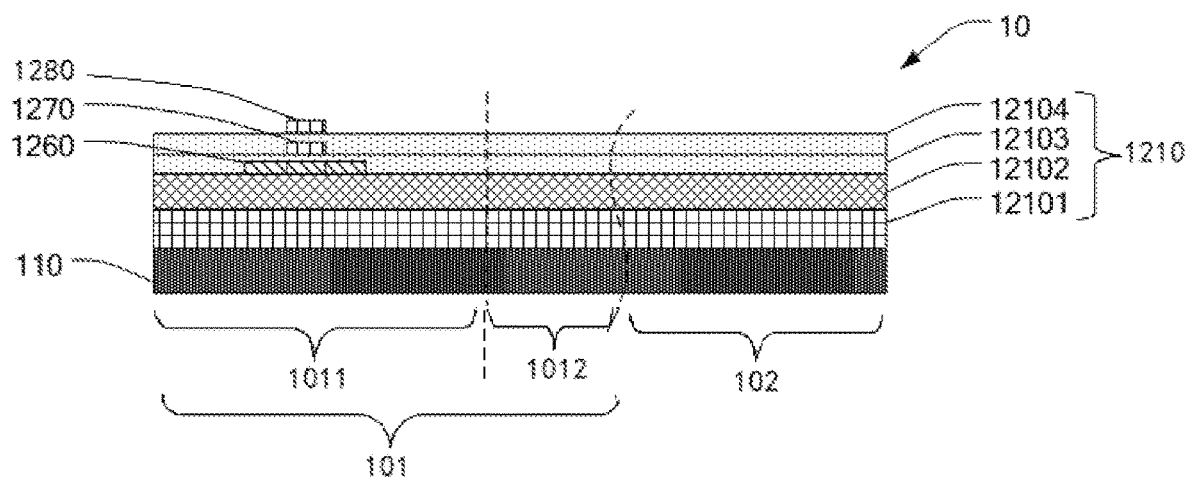
FIG. 2 is a layer diagram of the process of manufacturing an array substrate of the embodiment of the present disclosure after the formation of the second gate layer.

As shown in FIG. 2, the first gate insulating layer 12103 completely covers the semiconductor layer 1260. The first gate layer 1270 is disposed on the first gate insulating layer 12103, and the second gate insulating layer 12104 completely covers the first gate layer 1270. The second gate layer 1280 is disposed on the second gate insulating layer 12104, and the organic dielectric layer 1220 is disposed on the second gate layer 1280.

Figure 5:
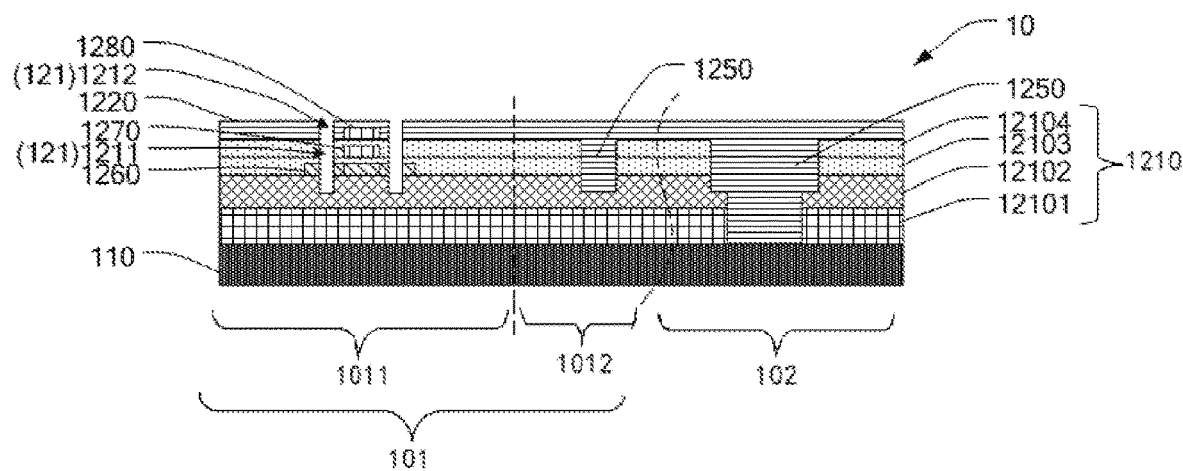
FIG. 5 is a layer diagram of the process of manufacturing an array substrate of the embodiment of the present disclosure after the formation of the organic dielectric layer.

As shown in FIG. 5, the organic dielectric layer 1220 is disposed on the second gate insulating layer 12104, and the passivation layer 1200 is disposed on the organic dielectric layer 1220 and corresponds to the pixel section 101. In the present embodiment, the material used for the passivation layer 1200 is silicon nitride and a thickness of the passivation layer is less than or equal to 3000 angstroms. The passivation layer 1200 can effectively perform some hydrogen replenishment on a channel of a thin film transistor of the array layer 120. The whole passivation layer 1200 in the bending section 102 is etched to facilitate the bending of the source-drain trace 1293. The planarization layer 1230 is disposed on the passivation layer 1200 and the organic dielectric layer 1220. The pixel defining layer 1240 is disposed on the planarization layer 1230.

As shown in FIG. 3 to FIG. 7, the array layer 120 in the pixel section 101 comprises a source-drain contact hole 121 and an anode contact hole 122, and the source-drain contact hole 121 extends to the interior of the buffer layer 12102 from the organic dielectric layer 1220. The source 1291 and the drain 1292 are disposed on the organic dielectric layer 1220 and extend from the corresponding source-drain contact hole 121 and connect to the semiconductor layer 1260. The anode contact hole 122 extends from the planarization layer 1230 to a surface of the drain 1292 through the passivation layer 1200, and the anode trace 1294 is disposed on the planarization layer 1230 and extends through the anode contact hole 122 and connects to the drain 1292. The pixel unit section 1011 of the present embodiment is a section corresponding to a single thin film transistor formed by the semiconductor layer 1260, the source 1291, the drain 1292, and the like, while non-pixel unit section 1012 is a section corresponding to a non-thin film transistor, such as a section between two thin film transistors or a section that is adjacent to the thin film transistor and the bent section 102.

Figure 3:
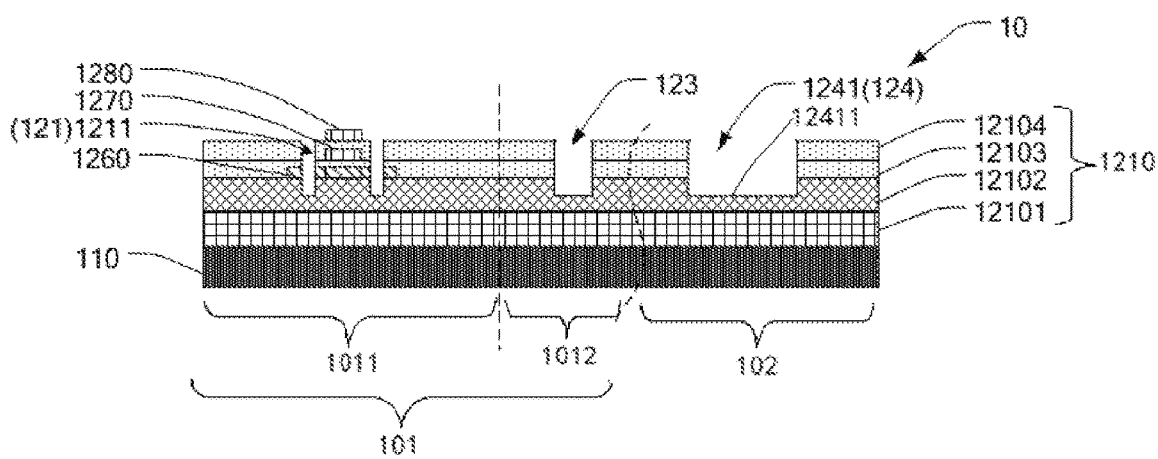
FIG. 3 is a layer diagram of the process of manufacturing an array substrate of the embodiment of the present disclosure after the formation of the first recess layer.
Figure 4:
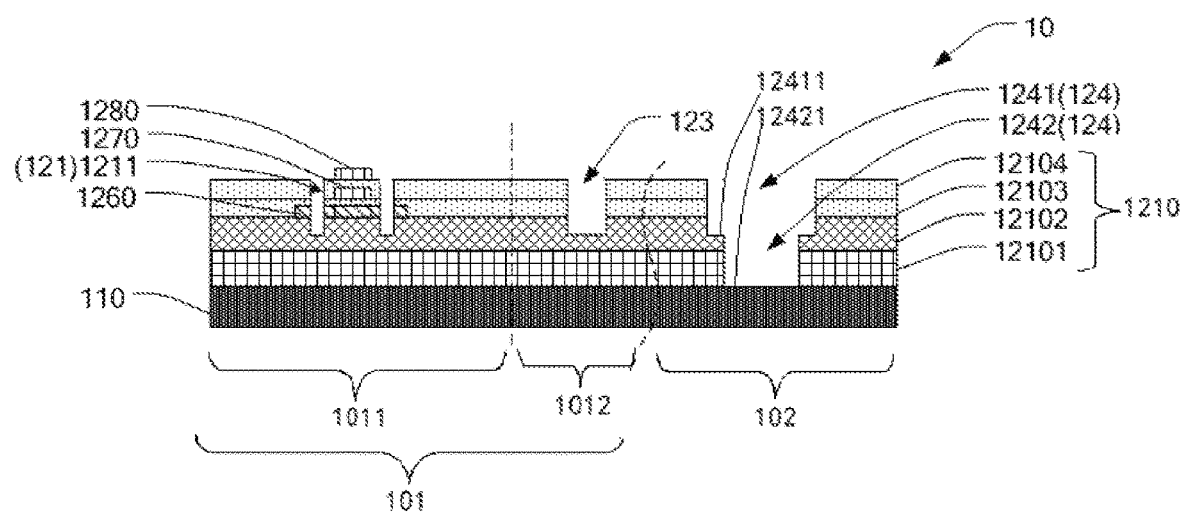
FIG. 4 is a layer diagram of the process of manufacturing an array substrate of the embodiment of the present disclosure after the formation of the second recess layer.

As shown in FIG. 3 and FIG. 4, in order to achieve the objects of the present disclosure, in the present embodiment, a first groove 123 and a second groove 124 are dug in the array base layer 1210. The first groove 123 corresponds to the non-pixel unit section 1012 in the pixel section 101, and the second groove 124 corresponds to the bending section 102. The first groove 123 is defined on the non-pixel unit section 1012, which can facilitate to avoid the semiconductor layer 1260, the source 1291, the drain 1292, the first gate layer 1270, the second gate layer 1280, etc. The second groove 124 forms a stepped structure in the array base layer 1210. In the actual manufacturing process, a first recess 1241 may be defined first. The first recess 1241 extends from the second gate insulating layer 12104 to an interior of the buffer layer 12102. The first recess 1241 comprises a first recess bottom 12411 and the first recess bottom 12411 is positioned at the interior of the buffer layer 12102. A second groove 1242 is then defined. The second groove 1242 extends from the first recess bottom 12411 of the first recess 1241 to a surface of the flexible substrate 110, and a vertical projection of the second recess 1242 on the flexible substrate 110 completely falls within a vertical projection of the first recess 1241 on the flexible substrate 110, and the second groove 124 that is constituted by the first recess 1241 and the second recess 1242 is a stepped structure. Of course, in the actual manufacturing process, a depth of the first recess 1241, the second recess 1242, and the step width formed by the first recess 1241 and the second recess 1242 can be adjusted according to the stress received by the source-drain trace 1293.

As shown in FIG. 5, the filling layer 1250 is filled in the first groove 123 and the second groove 124.

Figure 7:
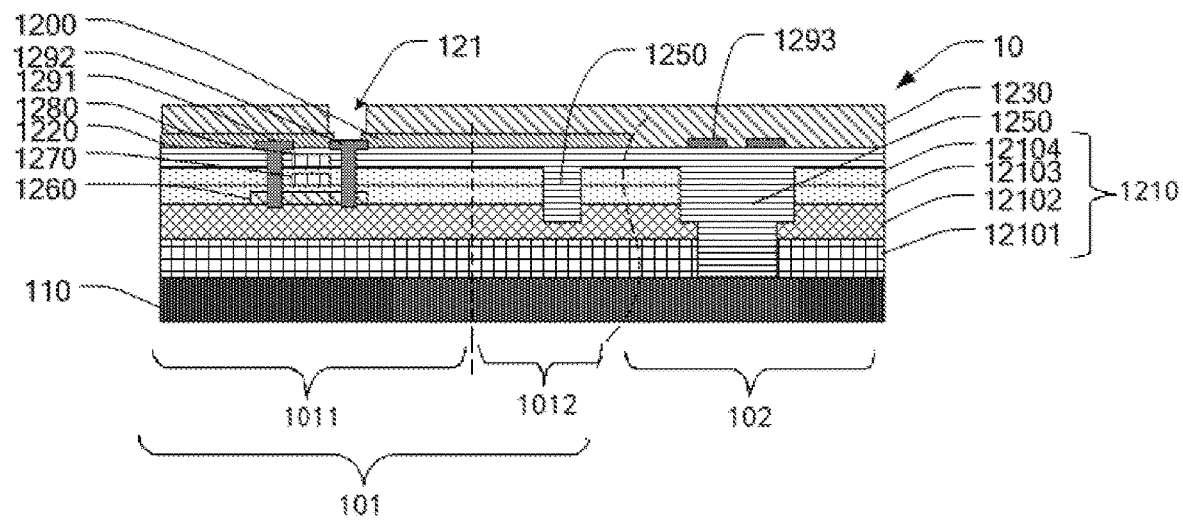
FIG. 7 is a layer diagram of the process of manufacturing an array substrate of the embodiment of the present disclosure after the formation of the planarization trace.

As shown in FIG. 7, the source-drain trace 1293 in the bending section 102 of the array substrate 10 is disposed on the organic dielectric layer 1220. The planarization layer 1230 is disposed on the source-drain trace 1293 and the organic dielectric layer 1220. The organic dielectric layer 1220 is disposed on the array base layer 1210 and the filling layer 1250. Materials used for both the organic dielectric layer 1220 and the filling layer 1250 are organic photoresist materials. A thickness of the organic dielectric layer 1220 is 1 um to 1.8 um, a Young's modulus of the organic dielectric layer 1220 is less than or equal to 5 GPa, and a heat resistant temperature of the organic dielectric layer 1220 is 350° C. to 500° C.

Figure 9:
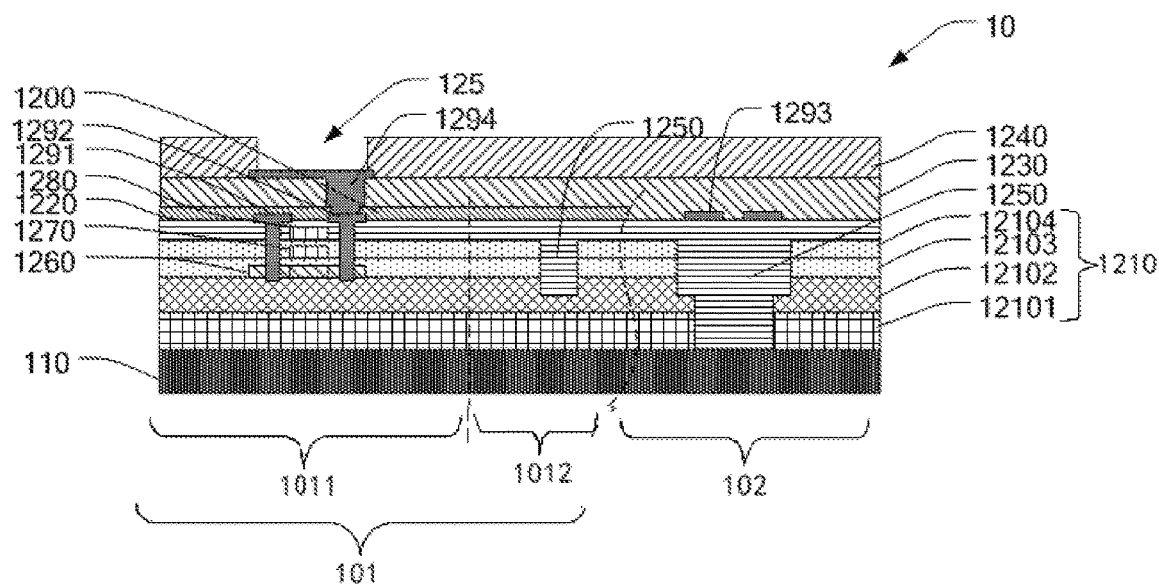
FIG. 9 is a layer diagram of the process of manufacturing an array substrate of the embodiment of the present disclosure after the formation of the pixel defining layer.

As shown in FIG. 9, the array layer 120 in the pixel section 101 further comprises a slot 125 extending through the whole pixel defining layer. The slot corresponds to the anode trace 1294. The light-emitting layer 12100 is filled in the slot 125.

In order to explain the array substrate 10 of the present disclosure more clearly, the present embodiment further provides a manufacturing method of an array substrate 10, comprising steps S1) to S9).

S1), as shown in FIG. 1, providing a flexible substrate 110, and the material of the flexible substrate 110 may be selected from polyimide.

S2), as shown in FIG. 1 and FIG. 2, forming an array base layer 1210 on the flexible substrate 110. Specifically, the step S21) comprises steps S21) to S24). S21) sequentially depositing a blocking layer 12101 and a buffer layer 12102 on the flexible substrate 110; S22) forming a semiconductor layer 1260 on the buffer layer 12102 in the pixel section 101; S23) depositing a first gate insulating layer 12103 on the semiconductor layer 1260 and the buffer layer 12102, depositing a first gate layer 1270 on the first gate insulating layer 12103, and patterning the first gate layer 1270 to form a first gate; S24) depositing a second gate insulating layer 12104 on the first gate and the first gate insulating layer 12103, depositing a second gate layer 1280 on the second gate insulating layer 12104 and the second gate layer 1280, and patterning the second gate layer 1280 to form a second gate.

S3) Referring to FIG. 3 and FIG. 4, a first groove 123 and a second groove 124 are defined on the array base layer 1210. The first groove 123 corresponds to the non-pixel unit section 1012 in the pixel section 101, and the second groove 124 corresponds to the bending section 102. The step S3) further comprises: holing the array base layer 1210 to form a first opening 1211. The first opening 1211 extends from the second gate insulating layer 12104 to an interior of the buffer layer 12102 and the first opening 1211 corresponds to the semiconductor layer 1260. The step of forming the second groove 125 in the step S3) comprises the following steps S31) to S32): S31) forming a first recess 1241, and the first recess 1241 extends to an interior of the buffer layer 12102 from the second gate insulating layer 12104, the first recess 1241 comprises a first recess bottom 12411 that is positioned at the interior the buffer layer 12102; and S32) defining a second recess 1242, the second groove 1242 extends from the first recess bottom portion 12411 of the first recess 1241 to a surface of the flexible substrate 110, and defining a second recess bottom 12421 on the surface of the flexible substrate 110, a vertical projection of the second recess 1242 on the flexible substrate 110 completely falls within a vertical projection of the first recess 1241 on the flexible substrate 110, and the second groove 124 that is constituted by the first recess 1241 and the second recess 1242 is a stepped structure.

S4) Referring to FIG. 5, an organic photoresist material is filled in the first groove 123 and the second groove 124 to form a filling layer 1250 and continuing to coat the organic photoresist material on the filling layer 1250 and the array base layer 1210 to form an organic dielectric layer 1220. In the step S4), after the organic dielectric layer 1220 is formed, the organic dielectric layer 1220 is developed at a position of the first opening 1211 to form a second opening 1212 connects with the first opening 1211, and the second opening 1212 and the first opening 1211 form the source-drain contact hole 121.

Figure 6:
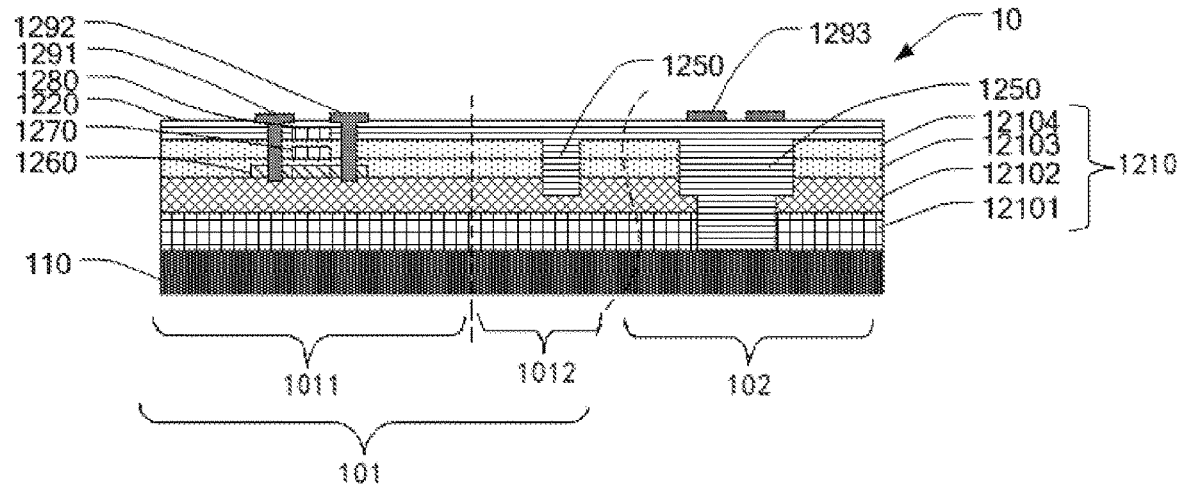
FIG. 6 is a layer diagram of the process of manufacturing an array substrate of the embodiment of the present disclosure after the formation of the source-drain trace.

S5) Referring to FIG. 6, depositing a first metal film layer in the source-drain contact hole 121 and the organic dielectric layer 1220, and patterning the first metal film layer to form a source 1291, the drain 1292, and the source-drain trace 1293. The source 1291 and the drain 1292 are correspondingly connected to the semiconductor layer 1260, and the source-drain trace 1293 are positioned at the bending section 102.

S6) Referring to FIG. 7, depositing a passivation layer 1200 on the source 1291, the drain 1292, and the organic dielectric layer 1220, and etching all of the passivation layer 1200 in the bending section 102.

Figure 8:
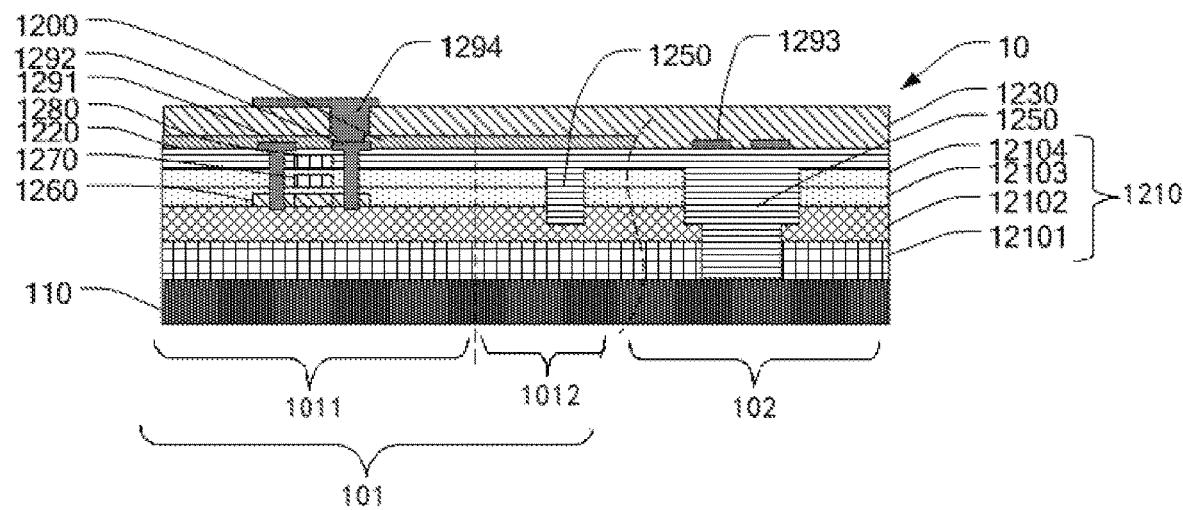
FIG. 8 is a layer diagram of the process of manufacturing an array substrate of the embodiment of the present disclosure after the formation of the anode trace.

S7) Referring to FIG. 7 and FIG. 8, forming a planarization layer 1230 on the passivation layer 1200, the organic dielectric layer 1220, and the source-drain trace 1293, and holing the planarization layer 1230 to form an anode contact hole 122, wherein the anode contact hole 122 extends through the passivation layer 1200 to a surface of the drain 1292 from the planarization layer; depositing a second metal film layer in the anode contact hole 122 and on the planarization layer 1230, and patterning the second metal film layer to form an anode trace 1294 connects with to the drain 1292.

S8) Referring to FIG. 9, forming a pixel defining layer 1240 on the planarization layer 1230 and the anode trace 1294, and digging a slot 125 on the pixel defining layer 1240, wherein the slot 125 extends through the whole pixel defining layer 1240 and corresponds to the anode trace 1294.

S9), Referring to FIG. 10, filling a light-emitting layer 12100 in the slot 125.

The present disclosure also provides a display device 1, comprising an array substrate 10, an integrated circuit (IC) 20, and a printed circuit board 30. The array substrate 10 comprises a bending section 102 and a pixel section 101. Compared the metal trace in the bending section 102 to metal trace of the rigid OLED, the fanout section of the flexible pad bending employs a source-drain trace and an external circuit, rather than a gate lead. In the present embodiment, the source-drain trace 1293 of the pixel section 101 of the array substrate 10 serves as a connection line of the Fanout section and connects to the IC 20. The IC 20 connects to the printed circuit board 30. The main design point of the display device 1 in the present embodiment is the array substrate 10 that enable the display device 1 having the array substrate 10 of the present disclosure to achieve a bending function in the pixel section 101. Therefore, other components of the display device 1 (such as pedestals, frames, or other diaphragms that improve optical quality, etc.) are not described in detail herein. In particular, the flexible structural layer 13 is disposed on the base substrate 12, and the flexible structural layer 13 is formed by superposing at least two flexible layers.

The preferred embodiments of the present disclosure are mentioned above, which cannot be used to limit the present disclosure. Any modifications or equivalent substitutions, and improvements made within spirit and principles of the present disclosure are considered encompassed in the scope of protection defined by the claims of the present disclosure.

The preferred embodiments of the present disclosure are mentioned above, which cannot be used to limit the present disclosure. Any modifications or equivalent substitutions, and improvements made within spirit and principles of the present disclosure are considered encompassed in the scope of protection defined by the claims of the present disclosure.

What is claimed is:

1. An array substrate, comprising a bending section and a pixel section that is adjacent to the bending section, wherein the pixel section comprises a plurality of pixel unit sections and a non-pixel unit section connects with the pixel unit section; wherein the array substrate comprises a flexible substrate and an array layer, and the array layer is disposed on the flexible substrate; the array layer comprises:
    an array base layer having a first groove and a second groove, wherein the first groove corresponds to the non-pixel unit section of the pixel section and a second groove corresponds to the bending section;
    a filling layer filled in the first groove and the second groove; and
    an organic dielectric layer disposed on the array base layer and the filling layer, wherein materials used for the organic dielectric layer and the filling layer are organic photoresist materials.

2. The array substrate of claim 1, wherein a stepped structure is formed within the array base layer by the second groove.

3. The array substrate of claim 1, wherein the array layer further comprises:
    a passivation layer disposed on the organic dielectric layer and corresponding to the pixel section;
    a planarization layer disposed on the passivation layer and the organic dielectric layer; and
    a pixel defining layer disposed on the planarization layer.

4. The array substrate according to claim 3, wherein materials used for the passivation layer is silicon nitride and a thickness of the passivation layer is less than or equal to 3000 angstroms;
    a thickness of the organic dielectric layer is 1 um to 1.8 um, a Young's modulus of the organic dielectric layer is less than or equal to 5 GPa, and a heat resistant temperature of the organic dielectric layer is 350° C. to 500° C.

5. The array substrate according to claim 3, wherein the array base layer comprises:
    a blocking layer disposed on the flexible substrate;
    a buffer layer disposed on the blocking layer;
    a first gate insulating layer disposed on the buffer layer; and
    a second gate insulating layer disposed on the first gate insulating layer;
    wherein the organic dielectric layer is disposed on the second gate insulating layer;
    the array layer in the pixel section further comprises:
    a semiconductor layer disposed on the buffer layer, wherein the first gate insulating layer completely covers the semiconductor layer;
    a first gate layer disposed on the first gate insulating layer, wherein the second gate insulating layer completely covers the first gate layer;
    a second gate layer disposed on the second gate insulating layer, wherein the organic dielectric layer is disposed on the second gate layer;
    a source-drain contact hole extending from the organic dielectric layer to an interior of the buffer layer;
    a source and a drain disposed on the organic dielectric layer, wherein the source and the drain extend through the corresponding source-drain contact hole and connect to the semiconductor layer; and the passivation layer is disposed on the source and the drain;
    an anode contact hole extending from the planarization layer to a surface of the drain through the passivation layer;
    an anode trace disposed on the planarization layer, wherein the anode trace extends through the anode contact hole and connects to the drain;
    a slot, extending through the whole pixel defining layer, wherein the slot corresponds to the anode trace; and
    a light emitting layer filled in the slot;
    wherein the array substrate in the bending section further comprises:
    a source drain trace disposed on the organic dielectric layer; wherein the planarization layer is disposed on the source-drain trace and the organic dielectric layer.

6. A display device, comprising the array substrate of claim 1.

7. The array substrate of claim 1, wherein the array base layer comprises a first recess, wherein the first recess extends to an interior of the buffer layer from the second gate insulating layer, the first recess comprises a first recess bottom that is at the interior the buffer layer.

8. The array substrate of claim 7, wherein the array base layer comprises a second recess, wherein the second recess extends to a surface of the flexible substrate from the first recess bottom of the first recess, and a second recess bottom is defined on the surface of the flexible substrate, a vertical projection of the second recess on the flexible substrate completely falls within a vertical projection of the first recess on the flexible substrate, and the second groove that is constituted by the first recess and the second recess is a stepped structure.

* * * * *